US008186100B2

(12) United States Patent
Chuang et al.

(10) Patent No.: US 8,186,100 B2
(45) Date of Patent: May 29, 2012

(54) PHOTOVOLTAIC GREENHOUSE STRUCTURE

(75) Inventors: Mei-Chen Chuang, Taipei County (TW); Cheng Chung, Taoyuan County (TW)

(73) Assignee: Lite-On Green Technologies, Inc., Taipei (TW)

( * ) Notice: Subject to any disclaimer, the term of this patent is extended or adjusted under 35 U.S.C. 154(b) by 394 days.

(21) Appl. No.: 12/505,523

(22) Filed: Jul. 19, 2009

(65) Prior Publication Data

US 2010/0236164 A1    Sep. 23, 2010

(30) Foreign Application Priority Data

Mar. 18, 2009 (TW) .............................. 98108827 A

(51) Int. Cl.
*A01G 9/00* (2006.01)
(52) U.S. Cl. ............................................................ 47/17
(58) Field of Classification Search ........................ 47/17
See application file for complete search history.

(56) References Cited

U.S. PATENT DOCUMENTS

| 7,748,137 | B2 * | 7/2010 | Wang ............................. 34/396 |
| 2001/0054252 | A1 * | 12/2001 | Kleinwachter .................. 47/17 |
| 2010/0236164 | A1 * | 9/2010 | Chuang et al. ............... 52/173.3 |
| 2011/0005128 | A1 * | 1/2011 | Chuang et al. .................... 47/17 |

* cited by examiner

*Primary Examiner* — Frank T Palo
(74) *Attorney, Agent, or Firm* — Li & Cai Intellectual Property (USA) Office

(57) ABSTRACT

A photovoltaic greenhouse includes a house structure having upstanding walls and a roof thereover to enclose a greenhouse space therein, and at least one thin-film solar cell module mounted on the roof for converting solar energy within a pre-selected light band of sunlight into electricity, wherein light not absorbed by the thin-film solar cell module passes through and enters the greenhouse space, which can be utilized by plants or crops for photosynthesis. The thin-film solar cell module has high transmittance of light in the wavelength intervals, for example, 400-450 nm and 640-700 nm, required by the cultured plants or crops inside the greenhouse space for photosynthesis.

8 Claims, 5 Drawing Sheets

PHOTOVOLTAIC GREENHOUSE STRUCTURE

BACKGROUND OF THE INVENTION

1. Field of the Invention

The present invention relates to a greenhouse structure. In particular, the present invention relates to a novel solar-energy type, photovoltaic greenhouse structure.

2. Description of the Prior Art

A greenhouse is useful against typhoons, acid rain and insect pests, as well as in lowering temperature in summertime and keeping temperature high enough in wintertime. Because a greenhouse can provide plants or crops with suitable environment to grow, it is often used to culture plants or crops of high economic value, such as orchids or melons.

As well known by persons of ordinary skills in the art, greenhouse engineering resides in selecting suitable covering materials to control the micro-climate inside the greenhouse in accordance with the biological requirements of the plants and with the local climate along with various control equipments installed inside the greenhouse to keep the plants or crops in their best conditions to grow.

In order to keep the inner temperature within a suitable range, a greenhouse is usually designed to be equipped with a ventilation apparatus to ventilate excess heat during hot summer days and to raise the temperature by heaters during the harsh, cold winter days which are disadvantageous for the plants and crops.

However, in certain extreme conditions, even in the presence of a ventilation apparatus, such as a ventilator, it is still very hard to keep the greenhouse within an ideal temperature condition. Accordingly, additional and expensive air conditioning is needed. Such air conditioning is costly and consumes a lot of energy.

Besides, in order to control the light intensity inside the greenhouse, a greenhouse is often shaded. Excess UV light may do damage to both the physiological and biological functions of plants, such as burned leaves. At the same time, a shaded greenhouse keeps harmful UV light out as well so plants inside the greenhouse may grow in a much more favorable condition.

However, the traditional way to shade a greenhouse can neither filtrate sunlight of a specific wavelength effectively nor control the light intensity or a pre-selected light band of sunlight effectively. In addition the traditional way to shade a greenhouse also blocks the sunlight, IR for example, which facilitates the growth of plants, or photosynthesis.

Given the above, the current greenhouse structure still needs further improving and advancing.

SUMMARY OF THE INVENTION

In view of the above technical problems, the present invention proposes an improved greenhouse structure to solve the abovementioned problems and drawbacks successfully.

The present invention therefore proposes a novel solar-energy type, photovoltaic greenhouse. The photovoltaic greenhouse of the present invention includes a main greenhouse frame structure with multiple upstanding walls and a roof thereon to enclose a green house space, and at least one thin-film solar cell module mounted on the roof. The thin-film solar cell module is useful in converting solar energy within a pre-selected light band of sunlight into electricity and simultaneously the light which is not absorbed by the thin-film solar cell module freely passes through the thin-film solar cell module and enters the greenhouse inner space. The sunlight freely passing through the thin-film solar cell module includes enough light which can be utilized by plants or crops for photosynthesis. In such a way, no additional money is spent as needed in the traditional way to shade a greenhouse, but adequate light intensity or adequate pre-selected light bands of sunlight is still provided within the greenhouse and, simultaneously sunlight is still sufficiently used for converting into electricity.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
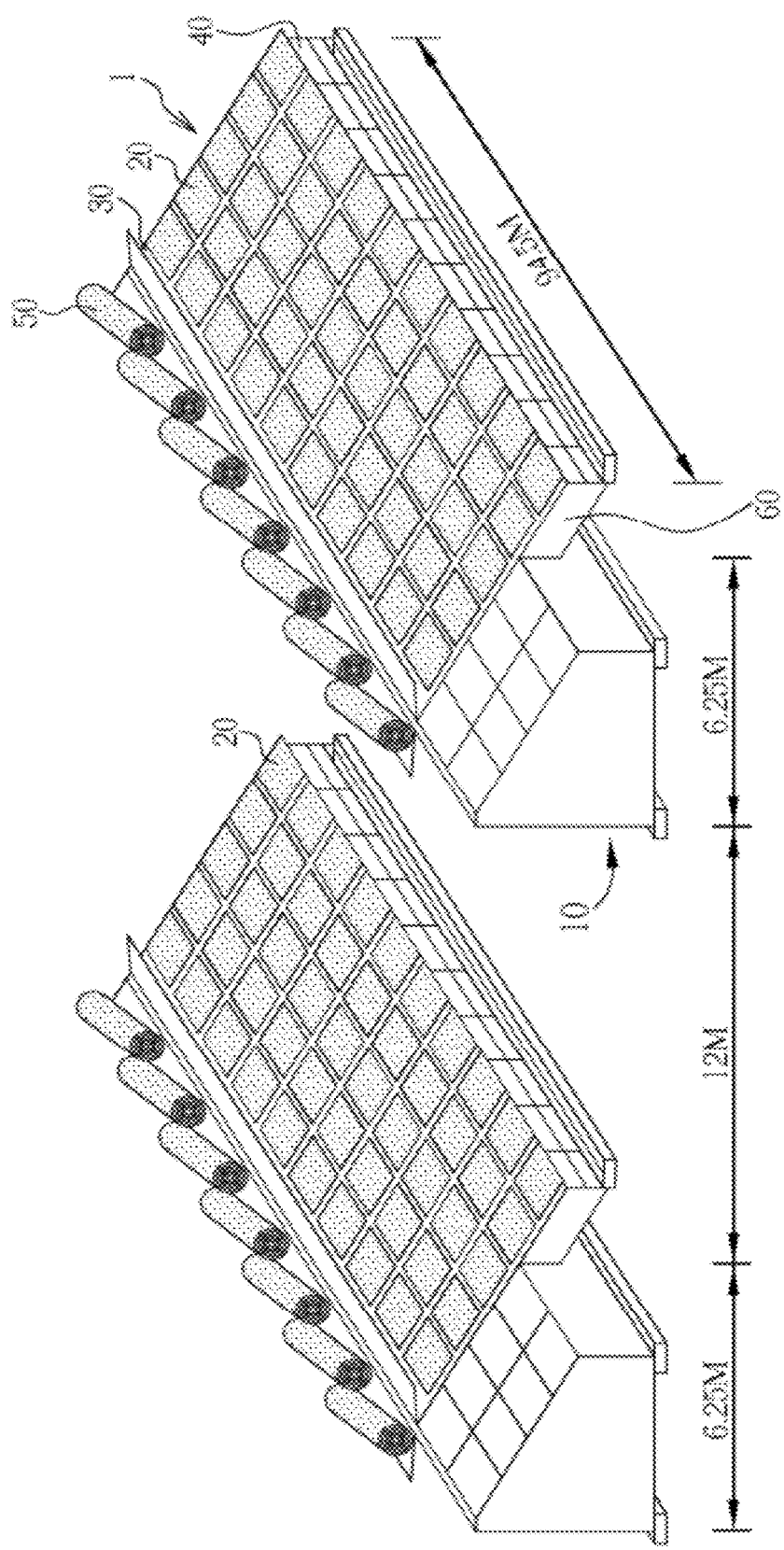
FIG. 1 illustrates a preferred embodiment of arrangement of the photovoltaic greenhouse of the present invention.
Figure 2:
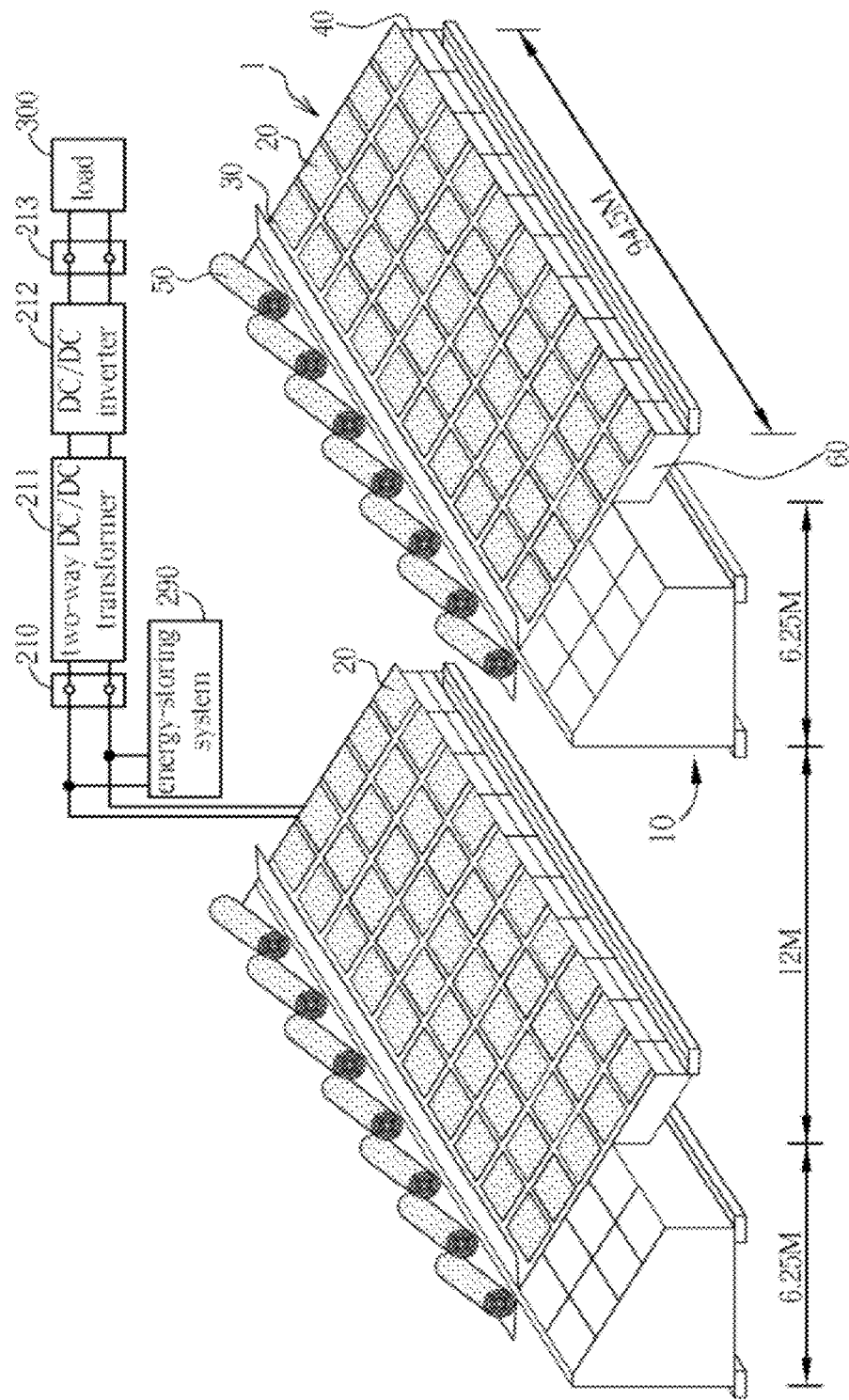
FIG. 2 illustrates a section view of the photovoltaic greenhouse illustrated in FIG. 1.

Please refer to FIG. 1 and FIG. 2. FIG. 1 illustrates a preferred embodiment of arrangement of the photovoltaic greenhouse of the present invention. FIG. 2 illustrates a section view of the photovoltaic greenhouse illustrated in FIG. 1. As shown in FIG. 1 and FIG. 2, the photovoltaic greenhouse 1 of the present invention includes a main greenhouse frame structure 10 made of a base 10*a* and multiple supporters or frames 10*b*. By means of the support of the base 10*a* as well as multiple supporters or frames 10*b*, a transparent panel 10*c* is mounted on a roof of the main greenhouse frame structure 10 or on the side facing the sunlight. To generate additional electricity, multiple thin-film solar cell modules 20 are mounted on the roof of the main greenhouse frame structure 10 or adjacent to the transparent panel 10*c*.

The transparent panel 10*c* may be a transparent material allowing sunlight to pass through, such as transparent glass, fiber glass or plastics. At least one transparent panel 10*c* may be vertically arranged or horizontally arranged for supplementing light, for uniform distribution of light or for sufficient distribution of light. The transparent panel 10*c* may be in a lens structure, such as a concave lens or any other suitable structure which allows light to be evenly distributed. The appearance structure of the photovoltaic greenhouse 1 may be one-sided, two-sided or in other shapes. The figures are for illustration purpose only.

Besides, there may be multiple ventilation holes or ventilation windows 30 which are selectively vertically arranged or horizontally arranged on the main greenhouse frame structure 10. Or, the ventilation holes or ventilation windows 30 may be disposed between the multiple thin-film solar cell modules 20. There are optional shelters 40 to be opened or closed on the main greenhouse frame structure 10. The optional shelters 40 may be opaque or transparent. The photovoltaic greenhouse 1 of the present invention may further include a thermal insulation material 50, for example an organic material such as straws or rubbers, or an inorganic material. The thermal insulation material 50 may be manipulated manually or mechanically.

The material for the upstanding walls 60 (side walls) of the photovoltaic greenhouse 1 may be opaque or transparent, depending on local sunlight or temperature. Further, the material for the upstanding walls 60 may be fixed or movable. There are optional ventilation holes or ventilation fans 70 on the main greenhouse frame structure 10. In some applications, there are some LED lights 80 installed in the photovoltaic greenhouse 1 to control the growth of the plants, the flowering cycles of plants, or to provide additional illumination during the nights.

Further, in accordance with the present invention, an autosprinkling system may be optionally installed in the greenhouse. The plants may be cultivated in the ground or on multi-layer shelves, for example soil culture, aeroponics or hydroponics. There may be plants or an aquaculture system in the greenhouse.

One aspect of the technical feature of the present invention is multiple thin-film solar cell modules 20 or large-area multiple thin-film solar cell modules 20 mounted on the roof of the main greenhouse frame structure 10 or on the side facing the sunlight. The thin-film solar cell module 20 may be an amorphous silicon thin-film solar cell module, a microcrystalline silicon thin-film solar cell module or a nano-crystalline silicon thin-film solar cell module. In one preferred example of the present invention, the thin-film solar cell module 20 is mounted on the transparent panel 10c. Or in another preferred example of the present invention, the thin-film solar cell modules 20 are disposed between the transparent panels 10c. If the roof is in a mesh shape, the thin-film solar cell module 20 may be mounted on the net-like frame to replace the transparent panels 10c.

To be noticed, in accordance with the present invention, the thin-film solar cell module 20 has to allow the sunlight to penetrate, i.e. a transmissive thin-film solar cell module. Further, the transmitted sunlight 3 which enters the main greenhouse frame structure 10 should contain a light bands of sunlight (for example blue ray or red ray) to facilitate photosynthesis of a given plant after passing through the thin-film solar cell module 20, when some light bands of sunlight (for example yellow ray or green ray) are absorbed by the thin-film solar cell module 20. For example, chlorophyll a absorbs maximally at 430 nm and 662 nm. In accordance with one preferred example of the present invention, the thin-film solar cell module 20 absorbs maximally in the 450-670 nm range, but is not limited to this. Preferably, the thin-film solar cell module 20 allows light energy in the 400-450 nm and 640-700 nm range to pass through with high transmission rate so as to facilitate photosynthesis of plants.

The principle of the present invention is to partially convert light energy into electricity but the light energy which is needed by the photosynthesis passes through the thin-film solar cell module 20 and enters the greenhouse to support the growth of the plants or crops. Simultaneously, because some light energy is absorbed by the thin-film solar cell module 20 which converts it into electricity, heat is less likely or less easily to accumulate inside the greenhouse so the temperature inside the greenhouse is moderately modulated. Moreover, the thin-film solar cell module 20 may be electrically connected to a city's power grid, parallel or not, and the electricity generated may be stored in a cell or in other suitable means. In such a way, the photovoltaic greenhouse of the present invention on one hand still provides sufficient sunlight in the absence of extra cost needed by the traditional way to shade a greenhouse, and on the other hand converts sunlight into electricity.

Taking the arrangement illustrated in FIG. 1 for example, for a 590 m² area, the size of the greenhouse is 94.5 m by 6.25 m and the size of each single thin-film solar cell module 20 is 1300 mm by 1100 mm. The greenhouse may consequently accommodate 333 pieces of the thin-film solar cell module 20. Supposing each thin-film solar cell module 20 generates 75 W electricity, the annual yield of one single thin-film solar cell module 20 is 25 kW and the annual yield of total thin-film solar cell module 20 is 29,200 kWh.

Figure 3:
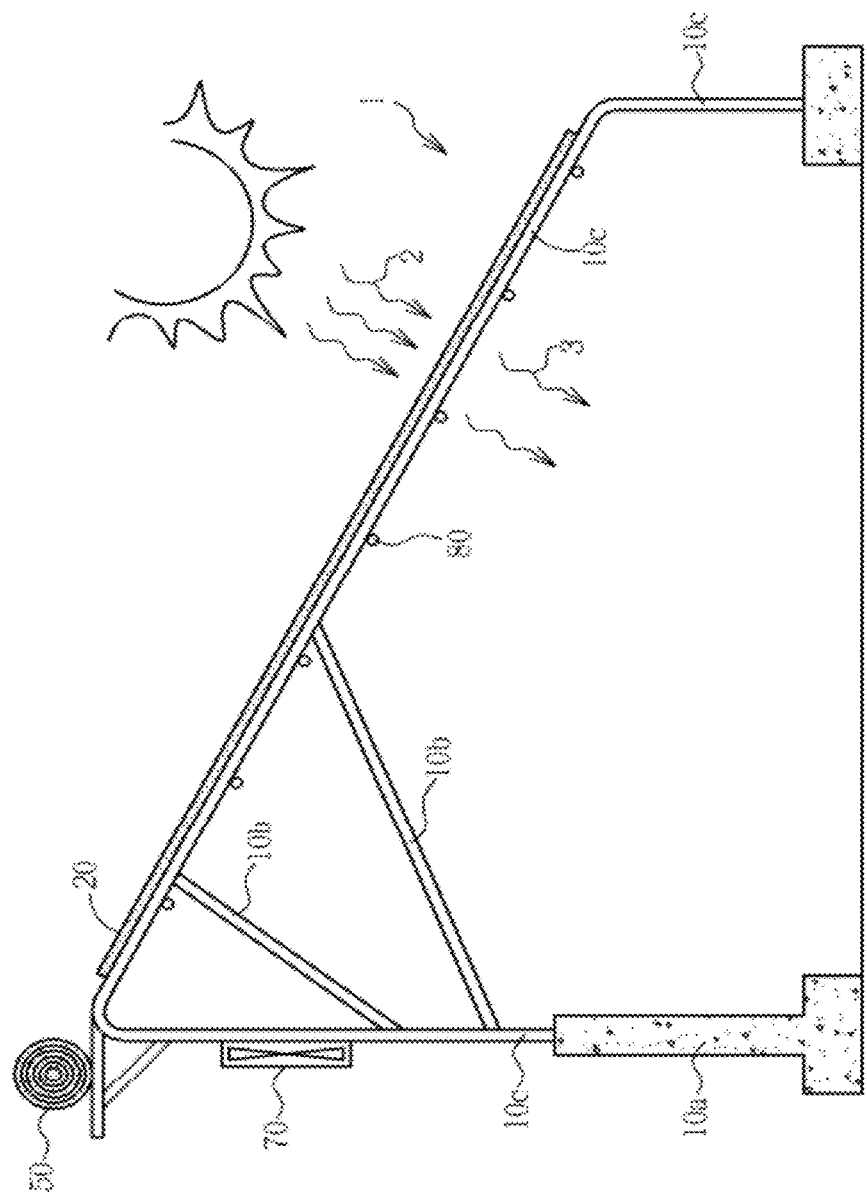
FIG. 3 illustrates another preferred embodiment of the present invention.

In another preferred embodiment of the present invention, the electricity generated by the photovoltaic greenhouse 1 may be parallel with a power grid equipped with suitable number of inverter and converter by at least one suitable step, as shown in FIG. 3. The thin-film solar cell module 20 in the photovoltaic greenhouse 1 may be electrically connected to a DC terminal 210 and an energy-storing system 290. The energy-storing system 290 may include a battery, a charger and/or a discharger. An AC terminal 213 is parallel with a load 300. Between the DC terminal 210 and the AC terminal 213 there may be a two-way DC/DC transformer 211 and a DC/DC inverter 212. Using such two-way transformer, the DC power generated from the thin-film solar cell module 20 and from the energy-storing system 290 may be transformed into an AC power for the load 300.

All the electronic equipments, such as the ventilation fan, a cooling apparatus, the heater, a humidifier, the sprinkler, the LED light, in the photovoltaic greenhouse 1 may be powered by the thin-film solar cell module 20. In addition to the energy-saving, light-band-modifying, self-supportive advantageous, the photovoltaic greenhouse 1 of the present invention may serve as a power plant of greenhouse built on the farm in the vicinity of big cities or of industrial areas, and provide other areas (such as residential areas or industrial areas) with the excess electricity.

In the past, because the pure solar power plant depends on large pieces of land to produce enough power and uses non-thin-film solar cell (crystalline silicon solar cell for example) which shields the light completely, the soil underneath becomes totally not suitable for farming, gardening or aquaculture because of lack of sunlight, so such solar power plant is usually located on the remote land far from the cities, rather than located on the farm in the vicinity of big cities or of industrial areas. Such selection of remote location must pay the toll of high loss in power transport, estimated around 20-30% loss.

In comparison, the photovoltaic greenhouse 1 of the present invention may be located on big farms in the vicinity of big cities or of industrial areas, and the power loss is therefore minimized. At the same time, the soil underneath is still suitable for farming, gardening or aquaculture. Farming and electricity-generating together maximizes the revenue of one singe unit land. The present invention has very high industrial utility because environment conservation and energy generation are not mutually exclusive any more.

Figure 4:
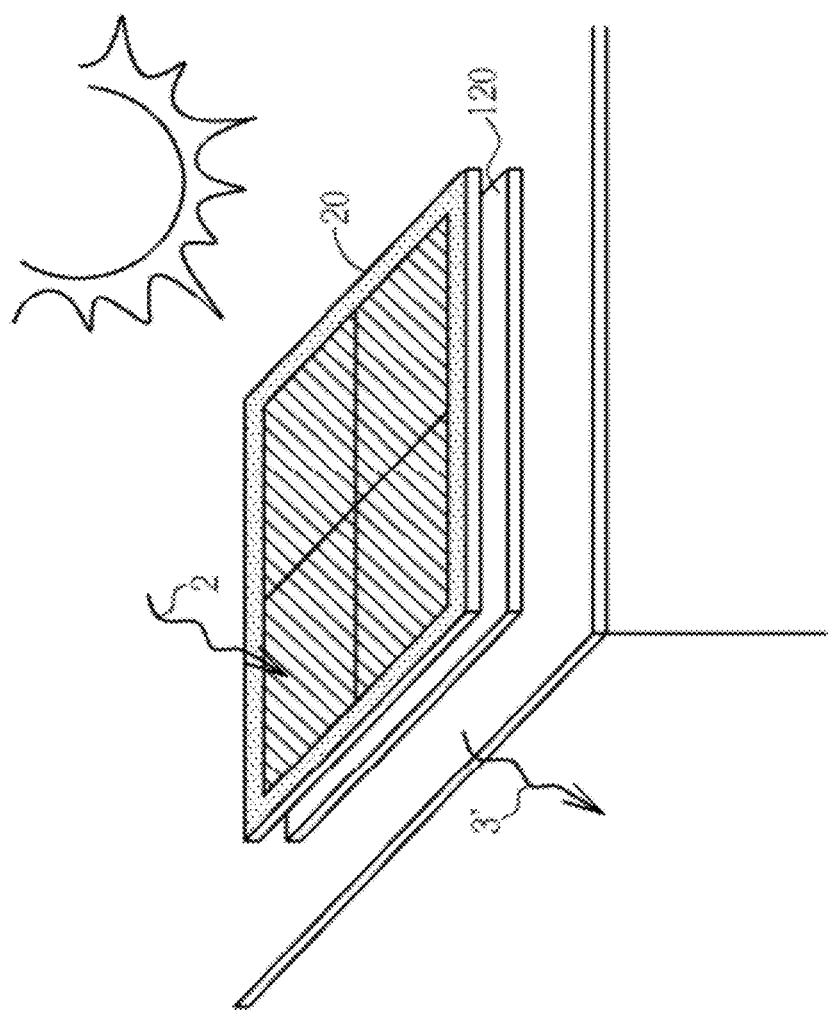
FIG. 4 illustrates another preferred embodiment of the photovoltaic greenhouse of the present invention.

Please refer to FIG. 4, illustrating another preferred embodiment of the photovoltaic greenhouse of the present invention. As shown in FIG. 4, the photovoltaic greenhouse 1 of the present invention may further include a filter 120 disposed under the thin-film solar cell module 20. A specific band of sunlight (yellow ray or green ray for example) in the sunlight 2 is absorbed after passing through the thin-film solar cell module 20 and before entering the main greenhouse frame structure 10 to filtrate some harmful wavebands, UV light for example, so that the transmitted light 3' contains only useful wavebands (for example blue ray or red ray) to facilitate photosynthesis for plants in the absence of harmful wavebands, i.e. W light. Last but not the least, the filter 120 may selectively allow a suitable light band for photosynthesis to pass through.

Of course, the arrangement illustrated in FIG. 4 is not limited to a greenhouse only and may have other applications. For example, it may be used in ordinary buildings to protect people therein from the damage of harmful UV light. The filter 120 may be made of glass, plastics, polarizer, or polymers.

In certain examples of non-limiting embodiments, there is no or very little cerium oxide present in the glass. Cerium oxide is a UV absorber, thus prevents UV from being transmitted through the glass. Accordingly, cerium oxide is not desirous in certain solar cell embodiments of this invention. In certain example embodiments of this invention, the glass contains no more than about 0.01% cerium oxide, more preferably no more than about 0.001% cerium oxide, still more preferably no more than about 0.0005% cerium oxide, and most preferably 0% cerium oxide. However, in alternative embodiments of this invention, it is possible to use a small amount of cerium oxide. For example and without limitation, in certain example embodiments of this invention, the glass contains, from about 0 to 0.2% cerium oxide, more preferably from about 0 to 0.1% cerium oxide, and possibly from about 0.001 to 0.09% cerium oxide. As with all material percentages herein, these amounts are in terms of wt. %. The term cerium oxide as used herein includes $Ce_2O_3$, $CeO_2$, or the like. In certain example instances, glass including cerium oxide herein may be used in applications such as greenhouse glazings where UV protection is desired.

Figure 5:
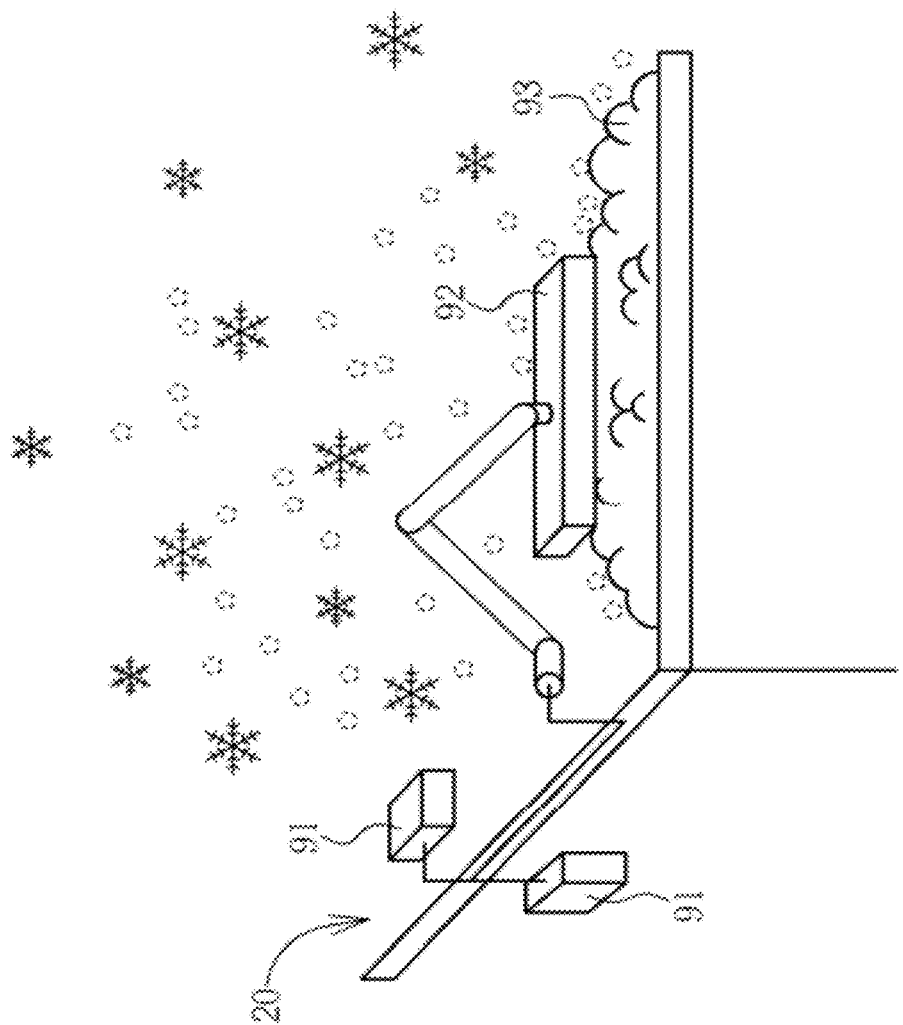
FIG. 5 illustrates a snow detector and a de-snow mechanism of the present invention.

In another aspect of the present invention, the thin-film solar cell is heavier than glass alone, which is supposed to take into consideration when the photovoltaic greenhouse is built. In some colder regions, it snows in winter and snow accumulates on the roof easily. The snow brings additional weight on the photovoltaic greenhouse and potentially does damages to the green house structure. In this aspect, please refer to FIG. 5, the present invention proposes an addition mechanism to detect and to clean the snow. For example, a snow detector 91 is useful for detecting an accumulated snow 93 on the on the thin-film solar cell module 20 or the roof and a de-snow mechanism 92 is useful for cleaning snow 93 on the thin-film solar cell 20 or the roof. The mechanism can be properly activated to protect the green house structure from the potential damages of the heavy snow.

In the mechanism, it can be properly activated by temperature, humidity or weight load threshold for the accumulated snow. If the temperature detector or the humidity detector determines it snows according to the temperature or humidity threshold, or the temperature of the thin-film solar cell drops to the threshold due to the accumulated snow on the thin-film solar cell, the de-snow mechanism is then activated by the snow detector for cleaning snow on the thin-film solar cell or the roof. Similarly, the weight sensor also activates the de-snow mechanism if additional weight on the thin-film solar cell, for example the accumulated snow, is present.

Because water or snow is easily evaporated by heating, the de-snow mechanism may be easily accomplished by providing heat from a heater. In the present invention a heater may be mounted on the thin-film solar cell module. The green house structure heater may also be equipped with a heater. The material then conducts heat to melt the snow. The mechanism may also be a mechanical means, for example a robot manipulator sweeps snow on the thin-film solar cell or the roof.

Also, in order to increase the efficiency of the thin-film solar cell module, the thin-film solar cell module may be equipped with a tilting device. The tilt angle of the thin-film solar cell module is adjusted in accordance with the angle of the sun. In wintertime, the tilting device may also prevent the snow from accumulating on the roof by providing a larger tilt angle.

Those skilled in the art will readily observe that numerous modifications and alterations of the device and method may be made while retaining the teachings of the invention.

What is claimed is:

1. A photovoltaic greenhouse comprising:
   a main greenhouse frame structure comprising a plurality of upstanding walls and a roof supported by said upstanding walls;
   at least one thin-film solar cell module mounted on said roof for converting solar energy by selectively absorbing a pre-selected light band of sunlight into electricity, wherein said solar energy which is selectively absorbed by said at least one thin-film solar cell module comprises a light band of sunlight to facilitate photosynthesis by a given plant; and
   at least one transparent panel disposed on said roof for supplementing light, for uniform distribution of light and sufficient distribution of light;
   wherein said thin-film solar cell module is disposed between said transparent panels.

2. The photovoltaic greenhouse of claim 1, wherein said thin-film solar cell module is selected from a group consisting of an amorphous silicon thin-film solar cell module, a microcrystalline silicon thin-film solar cell module and a nanocrystalline silicon thin-film solar cell module.

3. The photovoltaic greenhouse of claim 1, wherein said pre-selected light band of sunlight is between 450-640 nm.

4. The photovoltaic greenhouse of claim 1, wherein said upstanding walls are made of a material selected from a group consisting of a transparent material and an opaque material.

5. The photovoltaic greenhouse of claim 1, further comprising:
   a filter disposed under said thin-film solar cell module to make said thin-film solar cell module be light-band selective.

6. The photovoltaic greenhouse of claim 5, wherein said filter filters UV light only allows a suitable light band for photosynthesis to passes through.

7. The photovoltaic greenhouse of claim 6, wherein said thin-film solar cell module is parallel with a power grid equipped with an inverter and with a converter by at least one suitable step.

8. The photovoltaic greenhouse of claim 1, further comprising:
   a snow detector, for detecting an accumulated snow on the on the thin-film solar cell or the roof; and
   a de-snow mechanism, for cleaning snow on the thin-film solar cell or the roof and activated by the snow detector.

* * * * *